US012522924B2

(12) United States Patent
Jang et al.

(10) Patent No.: US 12,522,924 B2
(45) Date of Patent: Jan. 13, 2026

(54) SUBSTRATE PROCESSING DEVICE

(71) Applicant: JUSUNG ENGINEERING CO., LTD., Gwangju-si (KR)

(72) Inventors: Dae Soo Jang, Gwangju-si (KR); Hyeon Chang Kim, Gwangju-si (KR); Seung Youb Sa, Gwangju-si (KR); Kwang Su Yoo, Gwangju-si (KR); Ji Hun Lee, Gwangju-si (KR); Chul Joo Hwang, Gwangju-si (KR)

(73) Assignee: JUSUNG ENGINEERING CO., LTD. (KR)

(*) Notice: Subject to any disclaimer, the term of this patent is extended or adjusted under 35 U.S.C. 154(b) by 399 days.

(21) Appl. No.: 18/031,606

(22) PCT Filed: Aug. 30, 2021

(86) PCT No.: PCT/KR2021/011593
§ 371 (c)(1),
(2) Date: Apr. 12, 2023

(87) PCT Pub. No.: WO2022/080656
PCT Pub. Date: Apr. 21, 2022

(65) Prior Publication Data

US 2023/0374662 A1 Nov. 23, 2023

(30) Foreign Application Priority Data

Oct. 14, 2020 (KR) ........................ 10-2020-0132910

(51) Int. Cl.
*C23C 16/455* (2006.01)
*C23C 16/44* (2006.01)

(52) U.S. Cl.
CPC .... *C23C 16/45574* (2013.01); *C23C 16/4409* (2013.01)

(58) Field of Classification Search
CPC ........ C23C 16/45565; C23C 16/45574; C23C 16/4409
See application file for complete search history.

(56) References Cited

U.S. PATENT DOCUMENTS 7,718,030 B2 * 5/2010 Funk ................. H01J 37/32834 156/345.33
2003/0070620 A1 * 4/2003 Cooperberg ........ H01J 37/3244 118/723 AN (Continued)

FOREIGN PATENT DOCUMENTS

KR 20100131760 A 12/2010
KR 20110116907 A 10/2011

(Continued)

OTHER PUBLICATIONS

Hong, KR1020130131148, May 2012, Eng machine trans (Year: 2012).*
International Search Report for PCT/KR2021/011593 mailed Nov. 24, 2021.

*Primary Examiner* — Joseph A Miller, Jr.
(74) *Attorney, Agent, or Firm* — Renaissance IP Law Group LLP

(57) ABSTRACT

The present inventive concept relates to a substrate processing device, comprising: a chamber; a chamber lid that supports the upper portion of the chamber; a susceptor that is installed to face the chamber lid and supports a substrate; a gas ejection unit that ejects a plurality of gases; and an anti-sag bolt that is installed in the chamber lid and can be combined with the gas injection unit, wherein the anti-sag bolt includes a plurality of flow paths through which a plurality of gases can flow.

7 Claims, 4 Drawing Sheets

(56) References Cited

U.S. PATENT DOCUMENTS

| | | | |
|---|---|---|---|
| 2015/0279619 | A1 | 10/2015 | Cho et al. |
| 2016/0104624 | A1 | 4/2016 | Fu et al. |

FOREIGN PATENT DOCUMENTS

| | | | |
|---|---|---|---|
| KR | 20130120787 | A | 11/2013 |
| KR | 20130131148 | A | 12/2013 |
| KR | 101690971 | B1 | 12/2016 |

* cited by examiner

SUBSTRATE PROCESSING DEVICE

TECHNICAL FIELD

The present disclosure relates to a substrate processing apparatus, and more particularly, to a substrate processing apparatus for uniformly forming a thin film on a large-area substrate.

BACKGROUND ART

Generally, a certain circuit pattern or optical pattern should be formed on a substrate such as a semiconductor wafer or glass, for manufacturing a solar cell, a semiconductor device, a flat panel display device, etc. To this end, a semiconductor manufacturing process, such as a deposition process of depositing a thin film including a specific material on a substrate, a photo process of selectively exposing a portion of a thin film by using a photosensitive material, and an etching process of removing the selectively exposed region of the thin film to form a pattern, is performed.

Moreover, as an area of a substrate increases progressively, a gas injector applied to a chamber should also have a large area, but a problem where one side of the gas injector sags occurs due to a cause where the gas injector is exposed to a high temperature in a substrate processing process.

According to the related art, a shaft is installed near a plurality of injection holes disposed in the gas injector so as to preventing sagging of the gas injector. Because a number of injection holes are disposed adjacent to one another in the gas injector, a size (a diameter) of a shaft is small, and due to this, there is a problem where it is unable to sufficiently support the gas injector. Also, there is a problem where a number of shafts should be installed because a size of a shaft is small. In addition, there is a problem where a portion coupled to a shaft does not inject a gas.

DISCLOSURE

Technical Problem

An embodiment of the present inventive concept is for providing a substrate processing apparatus for effectively preventing the sagging of a large-area gas injector for processing a large-area substrate.

Technical Solution

To accomplish the above-described objects, a substrate processing apparatus according to an embodiment of the present inventive concept may include: a chamber; a chamber lid supporting an upper portion of the chamber; a susceptor installed opposite to the chamber lid to support a substrate; a gas injector injecting a plurality of gases; and a sag prevention bolt installed in the chamber lid, the sag prevention bolt being capable of being coupled to the gas injector. The sag prevention bolt may include a plurality of paths enabling the plurality of gases to flow therein.

In the substrate processing apparatus according to an embodiment of the present inventive concept, at least one of the plurality of paths of the sag prevention bolt may supply a first gas, and the other paths of the plurality of paths of the sag prevention bolt may supply a second gas.

In the substrate processing apparatus according to an embodiment of the present inventive concept, the gas injector may include a plurality of injection holes for gas injection, the plurality of injection holes may be arranged at the same interval, and the sag prevention bolt may be coupled to the injection hole of the gas injector.

In the substrate processing apparatus according to an embodiment of the present inventive concept, the substrate processing apparatus may further include a protrusion path disposed in the injection hole of the gas injector to inject a gas.

In the substrate processing apparatus according to an embodiment of the present inventive concept, the sag prevention bolt may include a cooling means.

In the substrate processing apparatus according to an embodiment of the present inventive concept, a path of the sag prevention bolt may include an inlet path and an injection path, and the inlet paths may be provided in plurality.

In the substrate processing apparatus according to an embodiment of the present inventive concept, the substrate processing apparatus may further include a power supply. The sag prevention bolt may be supplied with power from the power supply.

MODE FOR INVENTION

Figure 1:
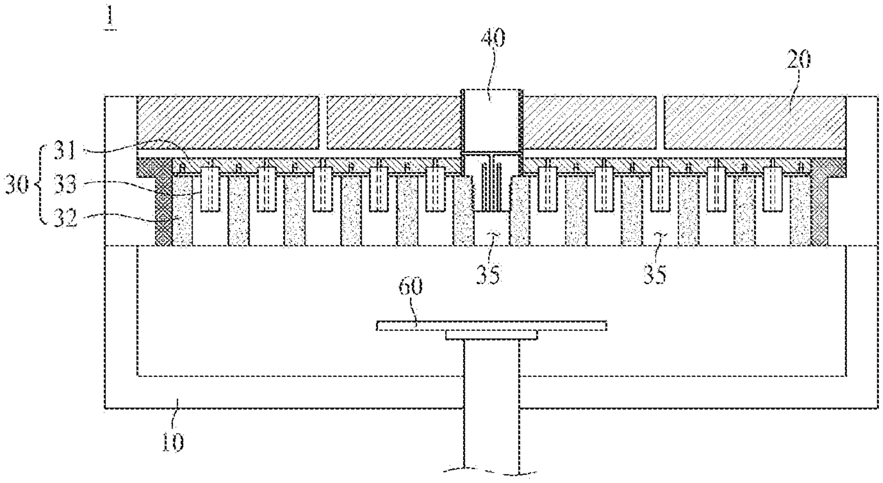
FIG. 1 is a diagram schematically illustrating a substrate processing apparatus according to an embodiment of the present disclosure.
Figure 2:
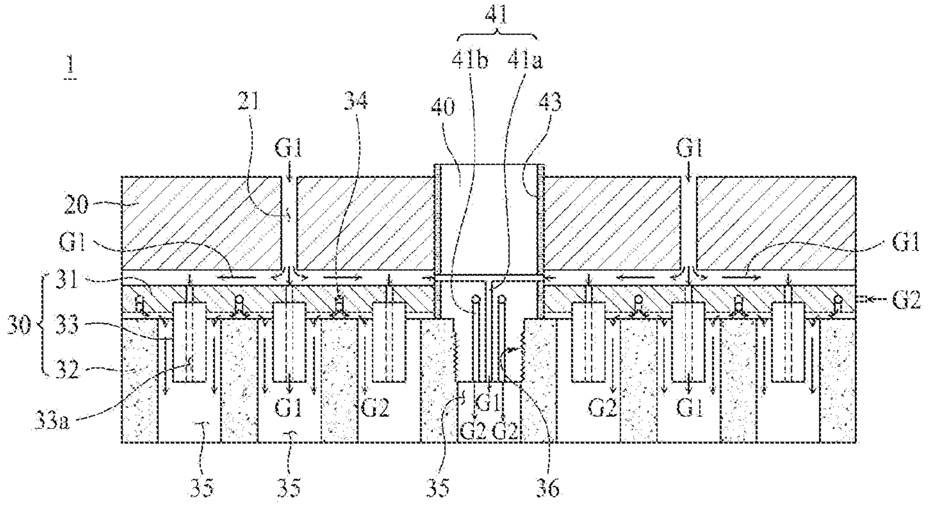
FIG. 2 is a diagram schematically illustrating a coupled state of a gas injector and a sag prevention bolt illustrated in FIG. 1.
Figure 3:
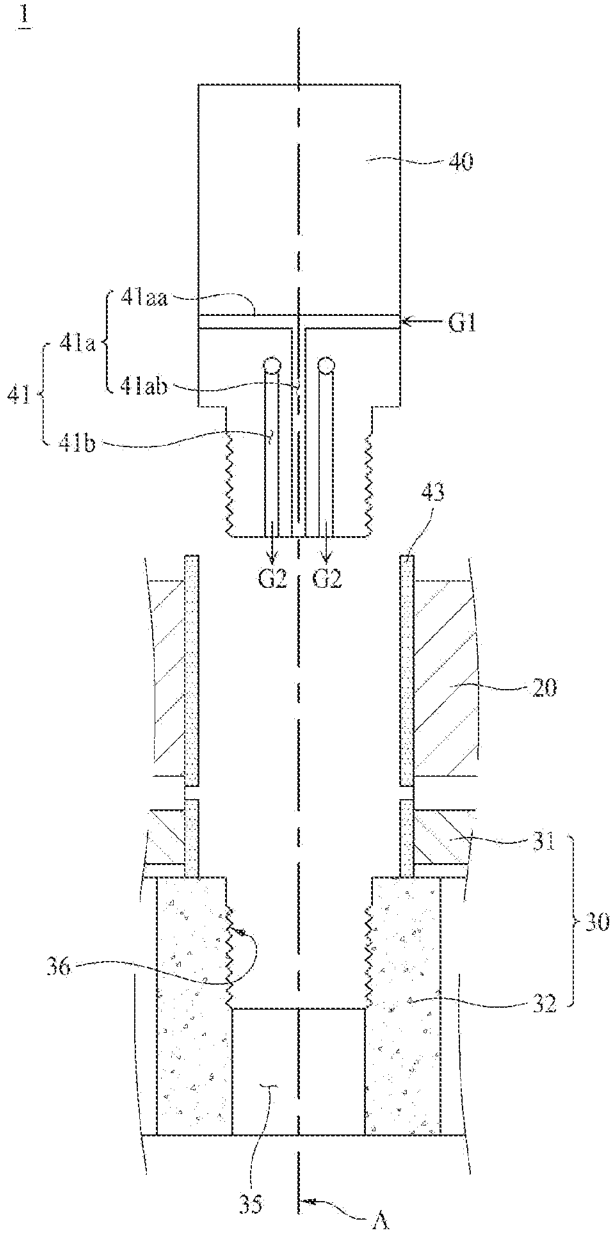
FIG. 3 is a diagram schematically illustrating a decoupled state of the gas injector and the sag prevention bolt illustrated in FIG. 2.
Figure 4:
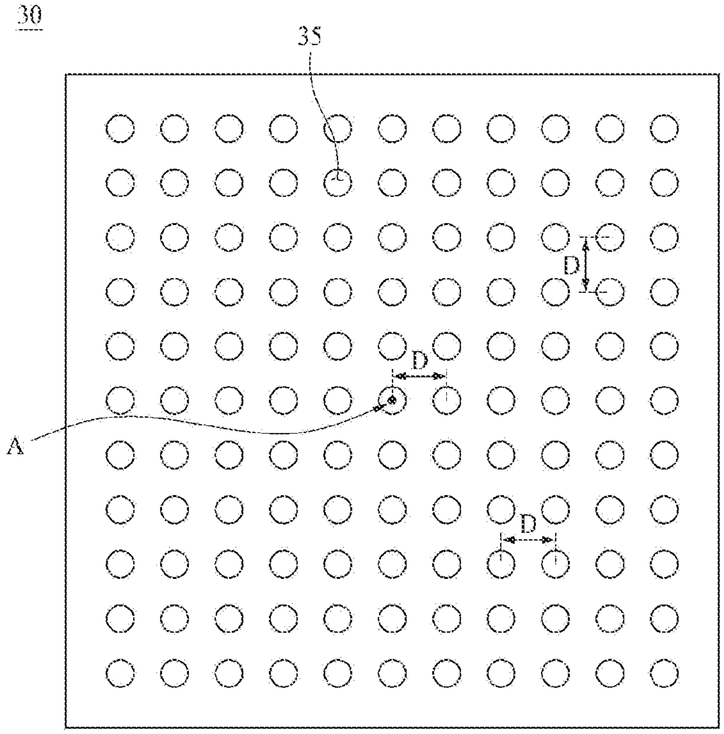
FIG. 4 is a bottom view illustrating a bottom surface of the gas injector illustrated in FIG. 2.

The terms described in the specification should be understood as follows.

As used herein, the singular forms “a”, “an” and “the” are intended to include the plural forms as well, unless the context clearly indicates otherwise. The terms “first” and “second” are for differentiating one element from the other element, and these elements should not be limited by these terms.

It will be further understood that the terms “comprises”, “comprising,”, “has”, “having”, “includes” and/or “including”, when used herein, specify the presence of stated features, integers, steps, operations, elements, and/or components, but do not preclude the presence or addition of one or more other features, integers, steps, operations, elements, components, and/or groups thereof.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as the first item, the second item, or the third item.

The term "on" should be construed as including a case where one element is formed at a top of another element and moreover a case where a third element is disposed therebetween.

The term "connection" should be construed as including a case where one element is directly connected to another element and moreover a case where a third element is disposed therebetween and is connected thereto.

Hereinafter, a substrate processing apparatus according to a preferable embodiment of the present inventive concept will be described in detail.

Referring to FIGS. 1 to 4, a substrate processing apparatus 1 according to an embodiment of the present inventive concept includes a chamber 10, a chamber lid 20, a gas injector 30, and a sag prevention bolt 40, for preventing the sagging of the gas injector in a processing process performed on a large-area substrate and for securing the uniformity of the large-area substrate.

The chamber 10 provides a processing space therein. A processing process such as a deposition process and an etching process may be performed on a substrate in the processing space. An exhaust port (not shown) which exhausts a gas from the processing space may be coupled to the chamber 10.

The chamber lid 20 covers and shields an upper portion of the chamber 10. The chamber lid 20 may include a path through which a first gas is supplied. The first gas may be supplied from the outside of the chamber 10 to a path of the chamber lid 20. The path of the chamber lid 20 may extend to vertically pass through the chamber lid 20. The chamber lid 20 may be screwed to an upper end of the sag prevention bolt 40.

The first gas G1 may be a source gas. The source gas may include a titanium group element (Ti, Zr, Hf, etc.), silicon (Si), or aluminum (Al). For example, a source gas including titanium (Ti) may be a titanium tetrachloride ($TiCl_4$) gas or the like. Also, a source gas including a silicon (Si) material may be a silane ($SiH_4$) gas, a disilane ($Si_2H_6$) gas, a trisilane ($Si_3H_8$) gas, a tetraethylorthosilicate (TEOS) gas, a dichlorosilane (DCS) gas, a hexachlorosilane (HCD) gas, a tri-dimethylaminosilane (TriDMAS) gas, or a trisilylamine (TSA) gas.

A susceptor 60 may be further disposed in the chamber 10. The susceptor 60 supports a substrate. The susceptor 60 may support one substrate, or may support a plurality of substrates. When a plurality of substrates are supported by the susceptor 60, a processing process may be performed on the plurality of substrates at a time. The susceptor 60 may be raised and lowered in a vertical direction in the chamber 10.

The gas injector 30 injects the first gas and a second gas. To this end, the gas injector 30 includes a first gas path and a second gas path. The gas injector 30 is disposed under the chamber lid 20. The gas injector 30 may be apart from the chamber lid 20 with an insulator therebetween. The gas injector 30 includes a plurality of injection holes 35 for gas injection. The plurality of injection holes 35 are arranged at the same interval D in the gas injector 30. In detail, the plurality of injection holes 35 are arranged at the same interval D on a bottom surface of the gas injector 30. That is, distances between centers of bottom surfaces (planes) of the plurality of injection holes 35 may be the same.

The sag prevention bolt 40 is coupled to the injection hole 35 of the gas injector 30. In this case, a screw coupling hole 36 is disposed in at least one of the plurality of injection holes 35. Here, the screw coupling hole 36 and an injection hole 35 communicating with the screw coupling hole 36 include the same center axis A. That is, the screw coupling hole 36 vertically communicates with the injection hole 35. Accordingly, an inner diameter of the screw coupling hole 36 may maximally increase between adjacent injection holes 35. That is, the supporting strength of the sag prevention bolt 40 may increase, and thus, the gas injector 30 having a large area may be stably supported.

In an embodiment, the gas injector 30 may include a first plate 31 and a second plate 32. The first plate 31 and the second plate 32 may be disposed vertically apart from each other. The first plate 31 may include the first gas path for the flow of the first gas G1 and a second gas path 34 for the flow of the second gas G2. The first gas path of the first plate 31 communicates with a path of the chamber lid 20. The second gas path 34 of the first plate 31 may communicate with a gas supply unit (not shown) and may be supplied with the second gas.

Also, the gas injector 30 may further include a protrusion path 33. The protrusion path 33 is disposed in the injection hole 35 of the gas injector 30. The protrusion path 33 includes a path 33*a* for injecting the first gas G1. The path 33*a* of the protrusion path 33 communicates with the first gas path of the first plate 31. Also, the second gas path 34 of the first plate 31 communicate with the injection hole 35. Accordingly, the second gas G2 is injected along an outer perimeter surface of the protrusion path 33 disposed in the injection hole 35.

The sag prevention bolt 40 may be installed in the chamber lid 20 and may be coupled to the gas injector 30. The sag prevention bolt 40 includes a plurality of paths 41 for the flow of the first gas G1 and the second gas G2. For example, at least one of the plurality of paths 41 of the sag prevention bolt 40 communicates with the path 21 of the chamber lid 20 and the first gas path of the first plate 31 and is supplied with the first gas G1. Also, the other paths 41 of the plurality of paths of the sag prevention bolt 40 communicate with the second gas path 34 of the first plate 31 and is supplied with the second gas G2.

The second gas G2 may be injected into the first plate 31 from the outside of the gas injector 30. The second gas G2 may be a reactant gas. The reactant gas may include a hydrogen ($H_2$) gas, a nitrogen ($N_2$) gas, an oxygen ($O_2$) gas, a nitrogen dioxide ($NO_2$) gas, an ammonia ($NH_3$) gas, a vapor ($H_2O$) gas, or an ozone ($O_3$) gas. In this case, the reactant gas may be mixed with a purge gas including a nitrogen ($N_2$) gas, an argon (Ar) gas, a xenon (Ze) gas, or a helium (He) gas.

Figure 5:
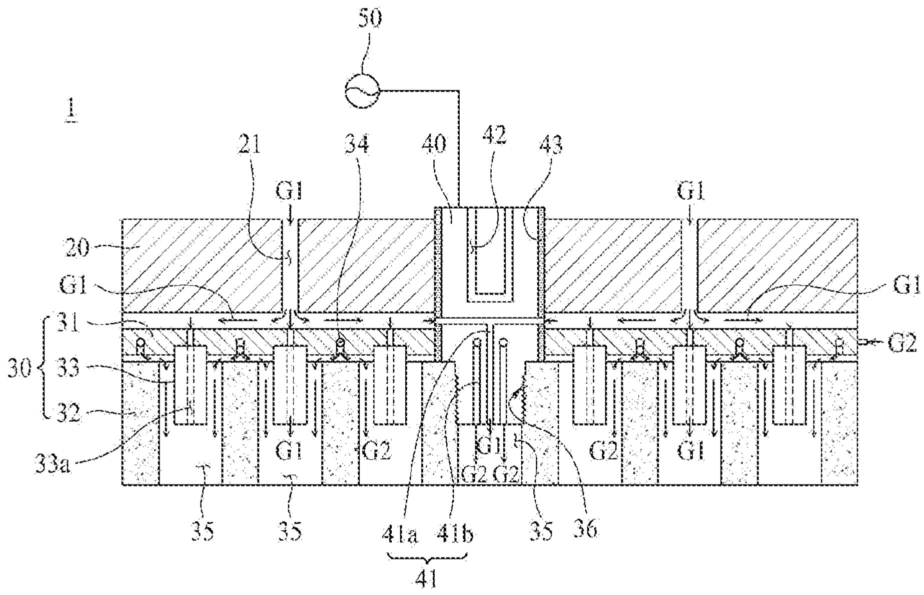
FIG. 5 is a diagram illustrating another embodiment of the sag prevention bolt illustrated in FIG. 2.

The substrate processing apparatus 1 according to an embodiment of the present inventive concept may further include a power supply (50 in FIG. 5). The power supply 50 may apply power to the sag prevention bolt 40. In this case, the sag prevention bolt 40 may be surrounded by an insulation unit 43.

In another embodiment, when power is applied, the gas injector 30 may operate as an electrode. When the gas injector 30 operates as an electrode, the gas injector 30 may be a first electrode (first plate) 31 or a second electrode (second plate) 32. Here, the first electrode 31 may include a protrusion path (a protrusion electrode) 33.

The second electrode 32 is disposed under the first electrode 31. The second electrode 32 may be apart from a bottom surface of the first electrode 31 by an insulator. The second electrode 32 may include the plurality of injection holes 35. The plurality of injection holes 35 may vertically pass through the second electrode 32.

The power supply 50 may apply the power to the sag prevention bolt 40. Here, the power may be radio frequency (RF) power. The power is applied to the second electrode 32 through the sag prevention bolt 40. Therefore, the second electrode 32 may be supplied with the power. The protrusion path 33 is connected to the first electrode 31 and the first electrode 31 is grounded, and thus, the protrusion path 33 is grounded. Also, the sag prevention bolt 40 applies the power to the second electrode 32 by using the power supply 50. Accordingly, plasma may be generated by the protrusion path 33 and the second electrode 32.

Figure 6:
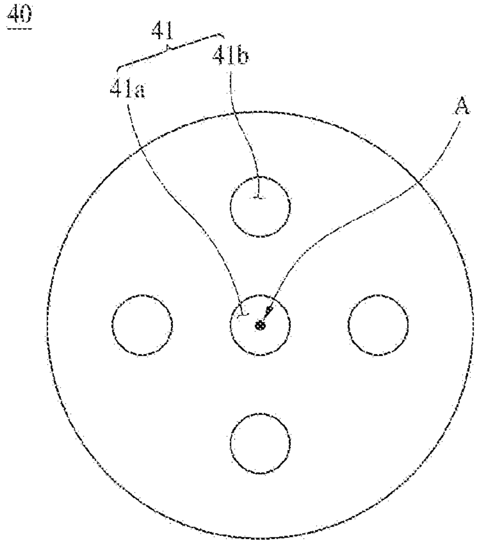
FIG. 6 is a bottom view illustrating a bottom surface of the sag prevention bolt illustrated in FIG. 2.
Figure 7:
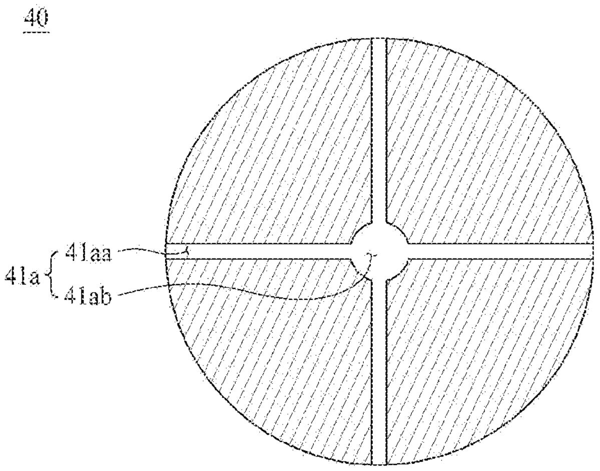
FIG. 7 is a cross-sectional view illustrating a bottom surface of the sag prevention bolt illustrated in FIG. 2.

Referring to FIGS. 5 to 7, the sag prevention bolt 40 may include a cooling means. In an embodiment, the cooling means may be a cooling path 42. The cooling path 42 is disposed in the sag prevention bolt 40. A cooling fluid may flow in the sag prevention bolt 40 through the cooling path 42. Accordingly, a stable operation may be secured by cooling the sag prevention bolt 40 which is heated by the applied power.

In an embodiment, a first gas path 41*a* of the sag prevention bolt 40 may be disposed at a center of the sag prevention bolt 40, and a second gas path 41*b* of the sag prevention bolt 40 may be disposed in plurality to surround the first gas path 41*a*.

Referring to FIG. 7, a path 41 of the sag prevention bolt 40 may include an inlet path and an injection path. Here, the path 41 of the sag prevention bolt 40 may be the first gas path 41*a*. That is, the first gas path 41*a* may include the inlet path 41*aa* and the injection path 41*ab*. The inlet path 41*aa* may be more disposed than the injection path 41*ab*. In this case, an inner diameter of the injection path 41*ab* may be greater than an inner diameter of the inlet path 41*aa*. Accordingly, a flow rate of a gas injected into the inlet path 41*aa* may be sufficiently discharged to the injection path 41*ab*.

Hereinabove, the invention implemented by the inventor has been described in detail according to the embodiment, but the present inventive concept is not limited to the embodiment and may be modified variously within the scope which does not depart from the gist.

The invention claimed is:

1. A substrate processing apparatus comprising:

a chamber;

a chamber lid supporting an upper portion of the chamber;

a susceptor installed opposite to the chamber lid to support a substrate;

a gas injector for injecting a plurality of gases into the chamber; and a sag prevention bolt installed in the chamber lid, the sag prevention bolt is coupled to the gas injector, wherein the sag prevention bolt comprises a plurality of paths enabling the plurality of gases to flow therein, wherein the gas injector comprises a plurality of injection holes for gas injection into the chamber, and the sag prevention bolt is coupled to at least one of the injection holes of the gas injector.

2. The substrate processing apparatus of claim 1, wherein at least one of the plurality of paths of the sag prevention bolt supplies a first gas, and the other paths of the plurality of paths of the sag prevention bolt supplies a second gas.

3. The substrate processing apparatus of claim 1, wherein the plurality of injection holes are arranged at the same interval.

4. The substrate processing apparatus of claim 3, further comprising a protrusion path disposed in at least one of the injection holes of the gas injector to inject a gas.

5. The substrate processing apparatus of claim 1, wherein the sag prevention bolt comprises a cooling means.

6. The substrate processing apparatus of claim 2, wherein the plurality of paths of the sag prevention bolt comprises a plurality of inlet paths and an injection path.

7. The substrate processing apparatus of claim 1, further comprising a power supply, wherein the sag prevention bolt is supplied with power from the power supply.

* * * * *